(12) United States Patent
Hettak et al.

(10) Patent No.: US 10,797,108 B2
(45) Date of Patent: Oct. 6, 2020

(54) PRINTED RECONFIGURABLE ELECTRONIC CIRCUIT

(71) Applicant: Her Majesty the Queen in Right of Canada, as represented by the Minister of Industry, through the Communications Research Centre Canada, Ottawa, Ontario (CA)

(72) Inventors: Khelifa Hettak, Ottawa (CA); Jafar Shaker, Ottawa (CA); Aldo Petosa, Nepean (CA); Jonathan Ethier, Carlsbad Springs (CA); Reza Chaharmir, Kanata (CA); Ming Li, Ottawa (CA); Nicolas Gagnon, Kanata (CA)

(73) Assignee: Her Majesty the Queen in the Right of Canada, as represented by the Minister of Industry, through the Communication Research Centre Canada, Ottawa, Ontario (CA)

( * ) Notice: Subject to any disclaimer, the term of this patent is extended or adjusted under 35 U.S.C. 154(b) by 0 days.

(21) Appl. No.: 15/963,379

(22) Filed: Apr. 26, 2018

(65) Prior Publication Data

US 2019/0074325 A1 Mar. 7, 2019

Related U.S. Application Data

(60) Provisional application No. 62/555,241, filed on Sep. 7, 2017.

(51) Int. Cl.
*H01L 21/02* (2006.01)
*H01L 27/28* (2006.01)
(Continued)

(52) U.S. Cl.
CPC ............ *H01L 27/283* (2013.01); *H01G 7/06* (2013.01); *H01L 21/02288* (2013.01);
(Continued)

(58) Field of Classification Search
CPC ............ H01L 27/283; H01L 21/02288; H01L 21/288; H01L 21/84; H01L 28/60;
(Continued)

(56) References Cited

U.S. PATENT DOCUMENTS 4,379,621 A * 4/1983 Ikedo ................ G02F 1/0555
348/795
6,225,802 B1 * 5/2001 Ramalho ............ G01R 27/14
324/207.21
(Continued)

FOREIGN PATENT DOCUMENTS

WO WO 2015/192248 12/2015 ............ H05K 1/09

OTHER PUBLICATIONS

M. Haghzadeh and A. Akyurtlu, "All-printed, flexible, reconfigurable frequency selective surfaces," Journal of Applied Physics, vol. 120, 184901, 2016.
(Continued)

*Primary Examiner* — Calvin Y Choi
(74) *Attorney, Agent, or Firm* — Teitelbaum & Bouevitch; Neil Teitelbaum

(57) ABSTRACT

An electronic component such as a voltage controllable reconfigurable capacitor or transistor is formed by printing one or more layers of ink on a non-conductive substrate. Ferroelectric ink or semi-conductive ink is printed and conductive resistive or dielectric ink is printed on a s same or different layers. Reconfigurability is achieved by printing resistive biasing circuitry wherein when a changing voltage
(Continued)

is applied to the biasing circuitry, an electronic property of the electronic component changes in response to the changing voltage.

20 Claims, 9 Drawing Sheets

(51) Int. Cl.
*H01L 49/02* (2006.01)
*H03J 3/20* (2006.01)
*H01G 7/06* (2006.01)
*H01L 21/84* (2006.01)
*H01L 51/00* (2006.01)
*H03J 3/18* (2006.01)
*H01L 29/93* (2006.01)
*H01L 21/288* (2006.01)
*H03J 5/24* (2006.01)
*H01L 27/105* (2006.01)
*H01L 51/05* (2006.01)

(52) U.S. Cl.
CPC ............ *H01L 21/288* (2013.01); *H01L 21/84* (2013.01); *H01L 27/105* (2013.01); *H01L 27/285* (2013.01); *H01L 28/40* (2013.01); *H01L 28/60* (2013.01); *H01L 29/93* (2013.01); *H01L 51/0004* (2013.01); *H03J 3/185* (2013.01); *H03J 3/20* (2013.01); *H03J 5/24* (2013.01); *H01L 51/0022* (2013.01); *H01L 51/0558* (2013.01)

(58) Field of Classification Search
CPC . H01L 29/93; H01L 51/0004; H01L 51/0022; H01L 51/0558; H01G 7/06; H03J 3/185; H03J 3/20

USPC ........................................................ 257/532
See application file for complete search history.

(56) References Cited

U.S. PATENT DOCUMENTS

| | | | |
|---|---|---|---|
| 2006/0049883 A1* | 3/2006 | Mattisson | H03B 5/36 331/158 |
| 2006/0176350 A1* | 8/2006 | Howarth | B41J 2/01 347/102 |
| 2007/0138462 A1* | 6/2007 | Street | H01L 27/283 257/40 |
| 2010/0271861 A1* | 10/2010 | Kitagawa | G11C 13/0009 365/148 |
| 2012/0206849 A1* | 8/2012 | Chew | G01R 29/0821 361/142 |
| 2014/0028112 A1* | 1/2014 | Hui | H02J 5/005 307/104 |
| 2017/0130084 A1* | 5/2017 | Kell | H01Q 1/2225 |

OTHER PUBLICATIONS

F. Bayatpur, K. Sarabandi, "Tuning performance of metamaterial-based frequency-selective surfaces," IEEE Transactions on Antennas and Propagation, vol. 57, No. 2, pp. 590-592, Feb. 2009.

E. A. Parker, S. B. Savia, "Active frequency selective surfaces with ferroelectric substrates", IEE Proceedings of Microwaves, Antennas and Propagation, vol. 148, (2), 2001, pp. 103-108.

Kiani, G. I., K. L. Ford, L. G. Olsson, K. P. Esselle, and C. J. Panagamuwa, "Switchable frequency selective surface for reconfigurable electromagnetic architecture buildings," IEEE Transactions on Antennas and Propagation, vol. 58, No. 2, 581-584, 2010.

C.Le, C.Wang, "Carbon nanotube flexible and stretchable electronics," Nanoscale research letters 10.1 (2015): 320.

* cited by examiner

PRINTED RECONFIGURABLE ELECTRONIC CIRCUIT

CROSS REFERENCE TO RELATED APPLICATIONS

The present invention claims priority from U.S. Patent Application No. 62/555,241 filed Sep. 7, 2017, which is incorporated herein by reference.

FIELD

The present invention relates generally to the fabrication of dynamically controlled electromagnetic surfaces and more particularly patterning these surfaces using a combination of various types of inks such as conductive, semiconductor, dielectric, resistive, ferroelectric inks and in multiple layers.

BACKGROUND

For the purposes of this invention, an engineered electromagnetic surface (EES) is defined as a non-conducting substrate, typically a dielectric substrate onto which is deposited metallic, dielectric, resistive, ferroelectric or semiconductor material in patterns designed in such a way as to alter, in a controlled manner, the behaviour of a radio signal in the form of an electromagnetic wave. Examples of EESs include: frequency-selective surfaces, having a periodic pattern of conductive elements, designed to only reflect or transmit radio signals within a desired frequency range; reflective/transmissive gratings, having of a set of conductive elements whose size, shape, and/or orientation are judiciously designed to reflect/transmit an incoming specific radio signal at a desired direction or directions; or reflectarrays/transmittarrays having of a set of conductive or dielectric elements whose size, shape, and/or orientation, are judiciously designed to either reflect or transmit an incoming specific radio signal into a given focal point.

Historically EESs have been fabricated using rigid microwave substrate sheets having relatively small surface area, and which have been primarily used for designing antennas or for placing in front of antennas to enhance their performance. A chemical etching or photolithographic process has traditionally been used to pattern these surfaces, and these patterns have primarily been implemented using metallic conductors.

The majority of these surfaces have been passive structures, meaning that once they are fabricated their electromagnetic behaviour cannot be modified. There has been some effort, however, to develop active EESs, whose electromagnetic behaviour, such as frequency, can be dynamically controlled, by integrating electronic devices within these surfaces. Integration of electronic devices into these surfaces is a complicated process involving the placement and soldering of discrete components such as surface-mount resistors, capacitors, inductors or switches over the EES, and requires complicated biasing circuitry. The resultant designs are expensive, and have limitations in their overall size, or in the range of frequencies over which their designs can be scaled.

The use of printed electronics is a promising technology providing low-cost fabrication of large-surface, flexible EESs, which can be deployed to control radio signals in order to engineer the radio-propagation environment and ultimately enhance performance of wireless communication systems.

Printed electronics refers to the printing of functional inks such as conductive, dielectric, resistive, ferroelectric, and semiconductor inks using traditional printing technologies such as aerosol spray, ink-jet, screen, roll-to-roll, gravure, and flexographic printers on flexible substrates such as thin plastics, by way of example PET, Kapton, Mylar, polycarbonate, paper, fabric, and textile material. Inkjet and screen-printing can also be applied directly on to rigid materials including rigid plastics, glass, and composite materials and even on certain construction material such as drywall or concrete. Commercially available conductive inks or dielectric inks, including inks comprising nanoparticles, are available from companies such as Novacentrix, Xerox, Sun Chemicals or Henkel; carbon-based resistive inks from companies such as Applied Ink Solutions or Creative Materials; ferroelectric inks from Solvay, and semiconducting inks from NanoIntegris.

Current EES designs fabricated using printed electronics are static, meaning that once they are fabricated and deployed, their electromagnetic behaviour cannot be modified or controlled. They are generally designed to either pass or stop electromagnetic waves over a specified range of frequencies. The frequency behaviour of such an EES is mainly determined by the geometry of its unit cell, and is also dependent on the permittivity of the dielectric substrate supporting the array. In most, if not all cases, these static EESs have been printed solely using conductive inks.

There are instances, however, where it is desirable to be able to electronically control the behaviour of EESs in order to adapt to changing wireless communication conditions where, for instance, the competing user demands for the available radio spectrum bandwidth need to be continuously optimized by network requirements and user priorities. In order for such a reconfigurable EES to be commercially viable, it needs to maintain all the same advantages of a static EES; for example, be low-cost, flexible, scalable to large-area coverage, and have the capability of being designed for a wide range of frequency bands, from current cellular and WiFi bands, up to WiGig, new millimetre-wave 5G bands and beyond, possibly up to terahertz frequencies.

Some electronically reconfigurable EES designs have been developed. They have been designed as tunable filters with the capability of switching between reflection and transmission, or shifting the filter continuously in a certain frequency band. This reconfigurability feature is generally achieved either by incorporating an active device into the EES elements as described by F. Bayatpur, K. Sarabandi, entitled "Tuning performance of metamaterial-based frequency-selective surfaces," in *IEEE Transactions on Antennas and Propagation*, Vol. 57, no. 2, pp. 590-592, February 2009, or by using tunable substrates as described by E. A. Parker, S. B. Savia, "Active frequency selective surfaces with ferroelectric substrates", in *IEE Proceedings of Microwaves, Antennas and Propagation*, Vol. 148, (2), 2001, pp. 103-108. A well-established method of tuning the EES is to incorporate electronically tunable components into its unit cell. A limited number of electronically tunable EESs have been designed by embedding solid-state varactor diodes taught by Bayatpur et al., and MEMS switches taught by Parker et al. in the traditional EESs.

Currently, there is no technology for the fabrication of large conformal reconfigurable EESs made of heterogeneous materials other than through the use of hybrid integration, where discrete active devices must be individually placed and connected, usually attached using solder or conductive adhesive onto the EES. This process is neither scalable in size nor in frequency, the former being limited by integration process, while the latter being limited by the finite-size footprints of the discrete active devices. There is no precedence for fabricated electronically reconfigurable EESs using a monolithic printed electronics EES.

The relatively large footprint of at least several square millimetres of discrete active devices that would be used in a hybrid integration technique would limit the operation of an electronically reconfigurable EES to frequencies below about 20 GHz. The process could not be scaled to the millimetre-wave frequencies currently used for WiGig or planned 5G communications. Mechanical robustness of the structure, fabrication complexity, biasing circuitry and high cost are other prohibiting factors in the adoption of such hybrid technology. Integrating the thousands or potentially tens of thousands of active devices required for the electronically reconfigurable EES would be prohibitively complicated, costly, and commercially impractical.

M. Haghzadeh and A. Akyurtlu, have described in an a paper entitled "All-printed, flexible, reconfigurable frequency selective surfaces," in *Journal of Applied Physics*, Vol. 120, 184901, 2016, band-pass frequency selective surfaces (FSSs) utilizing interdigitated capacitors (IDC) fabricated on a flexible substrate using printed electronics technology. In order to demonstrate the potential frequency tunability of this design, the spaces between the fingers of the IDCs were filled with barium strontium titanate/cyclic olefin copolymer (BST/COC) composite mixtures of different permittivities and the frequency responses of these filled designs were compared to the frequency response of a design with no BST/COC filling. It is important to note that the designs presented in this paper were not electronically tunable, as there was no biasing circuitry present, which is essential for electronic control.

OBJECT OF THE INVENTION

It is the object of the invention to remedy these drawbacks simply, reliably, effectively and efficiently.

SUMMARY OF THE INVENTION

In accordance with an aspect of the invention an electronic component is provided comprising:
  a dielectric substrate having printed thereon, in predetermined patterns, one or more layers of material wherein some of the material is a ferroelectric or semi-conductive, and some of the material is at least one of conductive, dielectric, and resistive; and, printed resistive biasing circuitry supported by the substrate electrically coupled to one or more of the printed layers, wherein when a changing voltage is applied to the biasing circuitry, an electronic property of the electronic component changes in response to the changing voltage.

In accordance with the invention there is further provided, an electronic component comprising:
a dielectric substrate having printed thereon:
a) a layer of conductive material to provide a loop resonator; and,
b) a plurality of layers forming metal insulator metal capacitors for loading the loop resonator, wherein each capacitor is formed of
a ferroelectric material and at least a conductive, dielectric or resistive, material; or
c) a conductive material and a ferroelectric material in interdigitated patterns forming capacitors for loading the loop resonator;
and,
d) resistive biasing circuitry electrically coupled to the capacitors for providing a varying voltage from a voltage source to the capacitors and for varying capacitance and for varying a resonant frequency of the loop resonator.

In accordance with another aspect of the invention a method of forming an electronic component is provided comprising:
  providing a substrate;
  printing upon the substrate in predetermined patterns one or more layers of ink wherein some of the ink is a ferroelectric ink or semi-conductive ink and wherein some of the ink is at least a conductive, dielectric or resistive, ink; and,
  printing with an ink biasing circuitry, supported by the substrate electrically coupled to one or more of the printed layers, for controlling the electronic component when coupled to a voltage source.

In yet another aspect of the invention there is provided a dynamically tunable resonator circuit comprised of a dielectric substrate having printed thereon one or more layers of printed material wherein a conductive material and ferroelectric material is printed on a layer so as to provide a loop resonator printed thereon and inter-digitated patterns printed thereon forming capacitors for loading the loop; and resistive biasing circuitry printed on the substrate electrically coupled to the capacitors for providing a varying voltage from a voltage source to the capacitors and for varying capacitance, and for varying a resonant frequency of the loop resonator.

There is further provided, a dynamically tunable resonator circuit comprising a dielectric substrate having printed thereon one or more layers of printed material wherein a layer of conductive material is printed thereon so as to provide a loop resonator printed thereon and a plurality of layers are printed thereon forming metal insulator metal capacitors for loading the loop on each side; and resistive biasing circuitry printed on the substrate electrically coupled to the capacitors for providing a varying voltage from a voltage source to the capacitors and for varying its capacitance and for varying a resonant frequency of the loop resonator, wherein each of the metal insulator metal capacitors are formed of a ferroelectric material and at least a conductive, dielectric or resistive, material.

In accordance with the invention a method of forming an electronic component is provided comprising: providing a non-conducting substrate; printing upon the substrate in predetermined patterns one or more layers of ink wherein some of the ink is a ferroelectric or semiconductive ink and wherein some of the ink is at least a conductive, dielectric or resistive, ink; and, printing with an resistive ink, having a resistance of at least 100 ohms per square millimeter, biasing circuitry, supported by the substrate electrically coupled to one or more of the printed layers, for controlling the electronic component when coupled to a voltage source. The biasing circuitry may have a resistance of at least 200 ohms per square millimetre, and wherein in operation, when a varying voltage is applied to the biasing circuitry, an electronic property of the electronic component varies, and wherein the electronic component if formed in the absence of etching.

DETAILED DESCRIPTION

The advent of printed electronics technology has allowed for low-cost fabrication of EESs over very large, thin and flexible surfaces, for example, plastic surfaces. The present invention relates to the fabrication of dynamically controllable EESs using single monolithic process by patterning these surfaces using a combination of various types of inks such as conductive, semiconductor, dielectric, resistive, ferroelectric, carbon nanotubes, etc. and in multiple layers, thus eliminating the requirement for integration of the discrete electronic components. By fabricating devices in this manner, it is possible to implement designs of EESs that can be utilized to dynamically control radio signals, thus engineering the radio-propagation environment. The combination of different functional inks engenders a whole range of functionalities for low-cost and large conformal electromagnetic surfaces.

Figure 1:
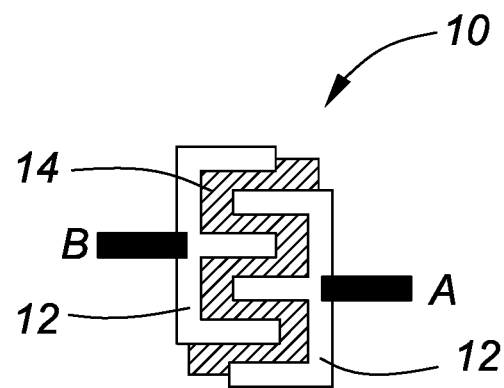
FIG. 1 is a top view looking down on an interdigitated variable capacitor printed with inks having different properties and with resistive biasing lines.

Referring now to FIG. 1 a variable capacitor or varactor 10 is shown formed by printing a single layer of interdigitated lines using a conductive ink 12, with the gaps between these lines of conductive ink filled with a ferroelectric printed ink 14. The two ends of the capacitor 10, labeled A and B in FIG. 1 are resistive bias lines printed with resistive ink. It should be understood that after the printed ink dries or cures, it becomes dried or cured ink, referred to hereafter as material or printed material. By applying a DC voltage to the bias lines A and B, the permittivity of the ferroelectric material 14 will change, which causes a change in the capacitance value of the varactor. A varying voltage over a range of voltages will result in a varying capacitance. In one embodiment, the varactor and biasing circuitry are integrated using a single monolithic printing process. In a less preferred embodiment the resistivity of the ink of the bias lines could range from about 4 to 25 milliohms per square per mil, however in more practicable useful embodiments having a large number of interconnected varactors, in order to have less loss, a higher resistance is required. For example in arrays of varactors resistive bias lines would be about 100 ohms or more per square millimetre preferably for large arrays, several hundred ohms per square per mil or higher.

Figure 2:
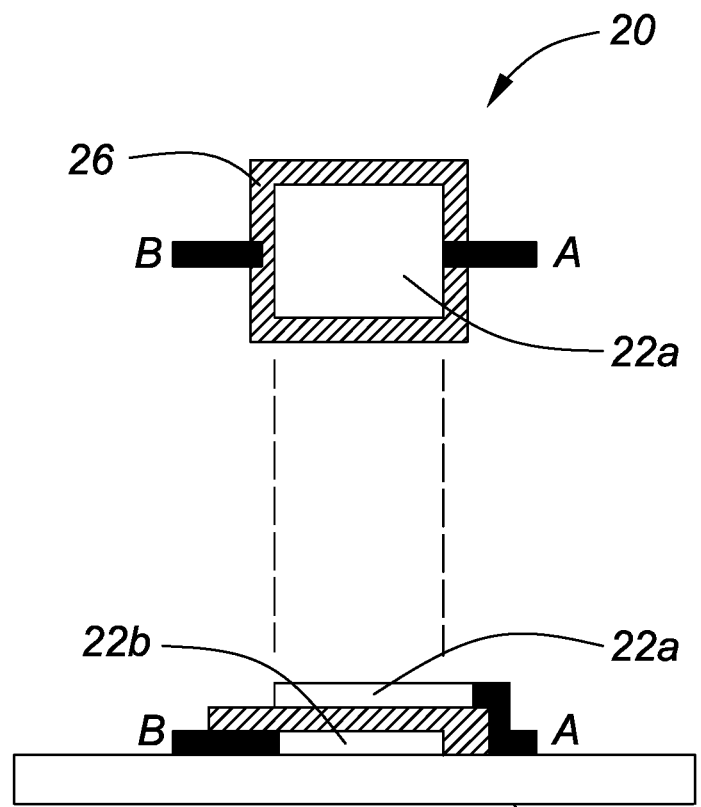
FIG. 2 is a top and side view of a multilayer MIM varactor with resistive biasing lines.

In another embodiment, a metal-insulator-metal (MIM) capacitor 20 is shown in FIG. 2. In this embodiment, multi-layer printing is required, where two metal plates 22a and 22b of the varactor are printed on different layers supported by the substrate 24, separated by printed ferroelectric material 26, which acts as an insulator with controllable dielectric properties. The interdigital design of FIG. 1 has the advantage of being printed as a single layer, but will require a higher bias voltage in order to change the permittivity of the ferroelectric material 14, thereby changing the capacitance value of the varactor. The MIM structure 20 requires a multi-layer printing process, but will need less DC bias voltage to change the permittivity of the ferroelectric material 26. This structure lends itself to use in large arrays of MIM varactors.

Figure 3A:
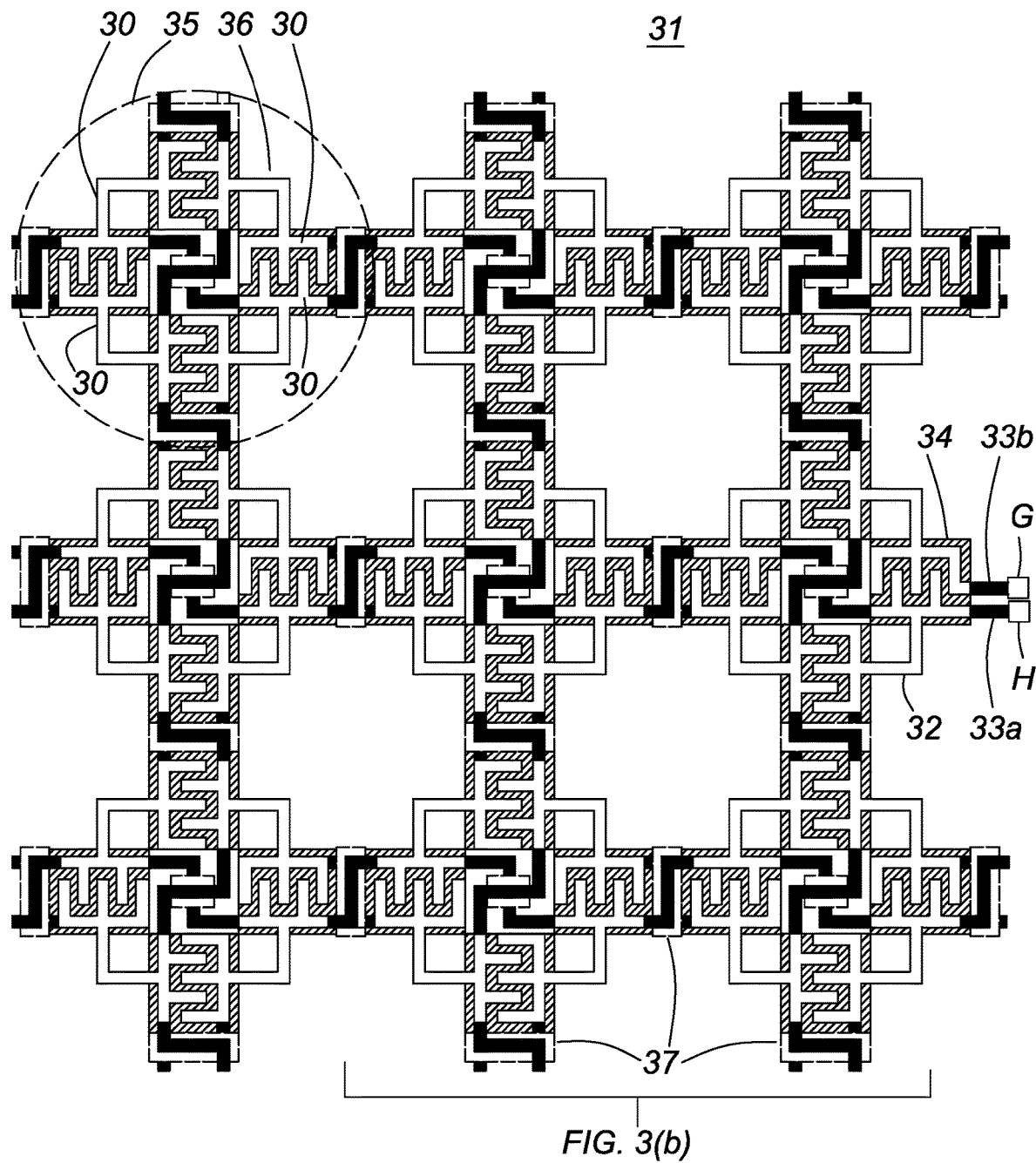
FIG. 3(a) is a top view and view showing a partial magnified view shown in FIG. 3(b) of reconfigurable EES using an array of interdigitated capacitors.

Turning now to FIG. 3(a), an embodiment of an electronically reconfigurable EES 31 designed to be fabricated using printed electronics technology is shown. It uses the basic interdigital varactor cell 10 of FIG. 1, where resistive material 33a, 33b is printed forming the bias lines G and H to isolate radio frequency (RF) and direct current (DC) signals and where ferroelectric material 34 is used to enable electronic control. The unit cell 35 of the EES, as identified in FIG. 3(a), consists of a square loop resonator 36 with an interdigital varactor 30 integrated in each side of the loop, wherein the varactors 30 are interconnected by printed conductive material 32 forming the loop. Each loop, has printed a plurality of resistive bias input lines. Dielectric material 37 is used as an insulator to prevent certain paths from electrically contacting one another. Applying a DC voltage bias to the structure causes the permittivity of the ferroelectric material 34 to change, which changes the capacitance of the varactor 30 and which, in turn, changes the resonant frequency of the square loop resonator. This allows for the dynamic tuning of the resonant frequency at which the EES 31 either blocks or passes through incoming radio-wave signals. The actual EES 31 may include hundreds or thousands of these voltage controllable unit cells arranged in a regular lattice configuration; only a few unit cells are shown in FIG. 3(a) along with a close-up view of two neighboring cells. One of the distinguishing features of this embodiment is the use of DC bias lines G and H, integrated with the EES 31 in the same monolithic process.

Figure 3B:
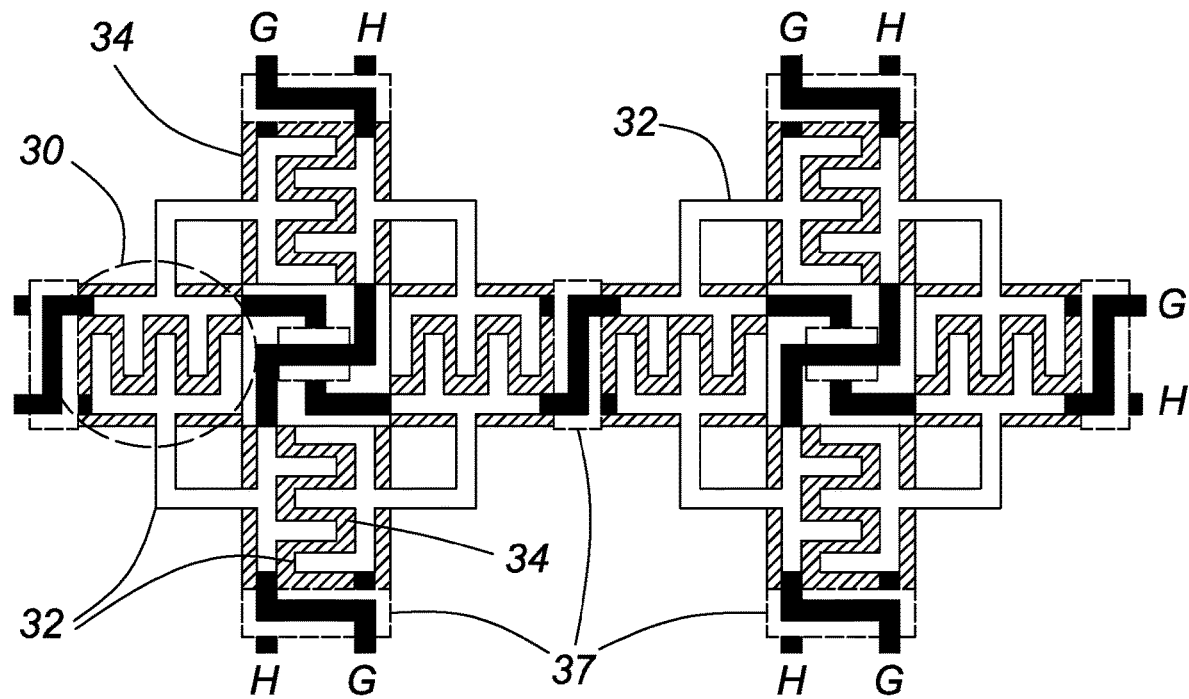
FIG. 3(c) is a top view of an EES using an array of MIM varactors.
Figure 3C:
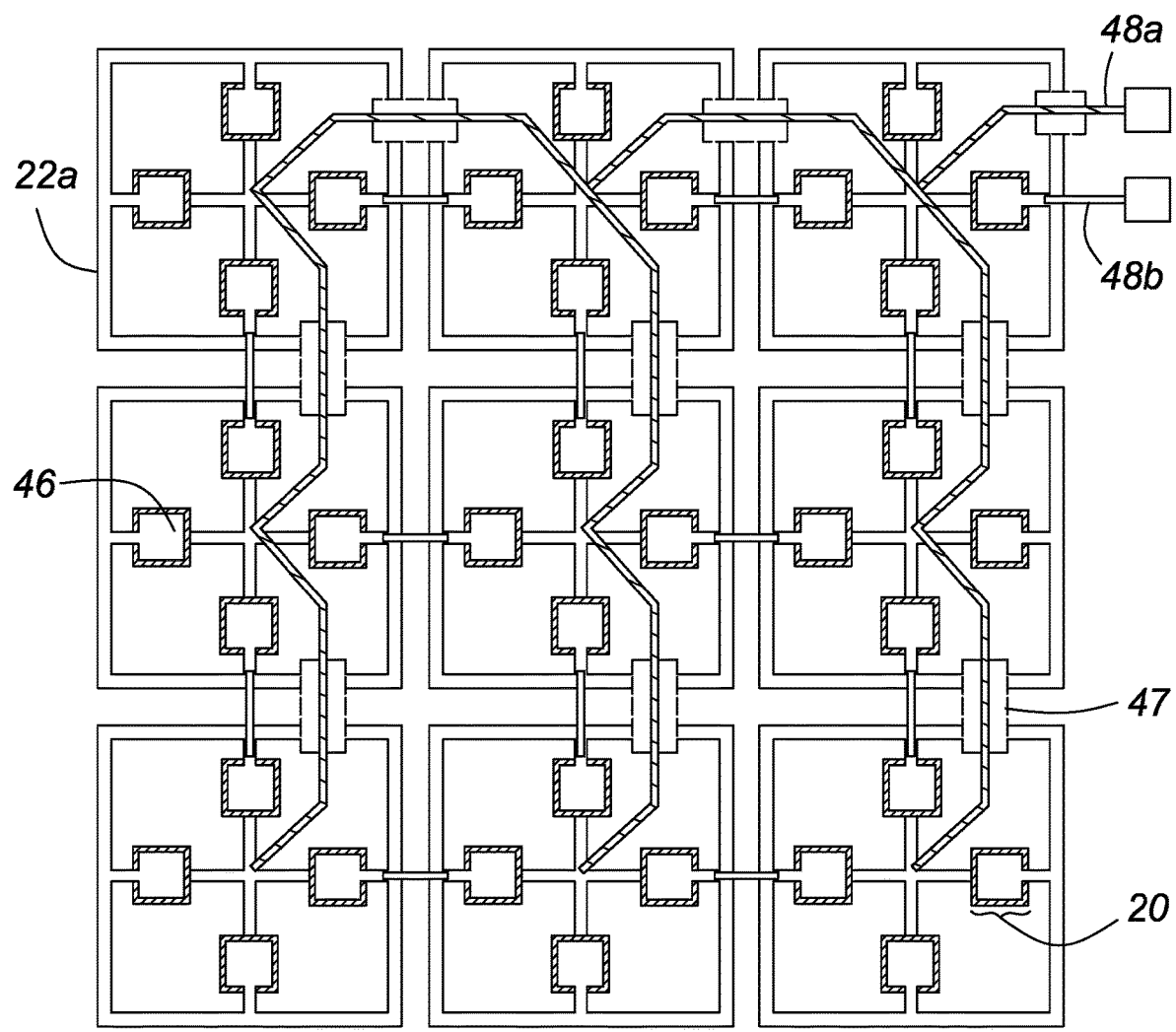

FIG. 3(c) shows a second embodiment where MIM varactors 20 as described in FIG. 2 are used instead of interdigital varactors 30 of FIG. 3(a). The principle of operation is the same as the embodiment of FIG. 3(a), but a smaller value of DC bias voltage would be required to obtain the same varactor tuning range. The varactors are coupled with conductive printed material 46 and resistive printed paths are shown as 48b. Dielectric printed material 47 is shown providing required insulation.

A salient feature of the suggested cell element of this invention is a self-resonating structure. Specifically, the proposed cell element described using interdigitated varactors 10 or MIM varactors 20 is a square loop, which is preferably loaded on each of its four sides by interdigital capacitors (IDC). This contrasts the design in where the capacitive loading is done between cell elements, not within the same cell element. In this invention, the capacitive loading within the cell element tends to shrink the size of the cell element, which improves the angular stability of the resulting FSS structure; advantageously its behavior is less sensitive to the angle of incidence of the incoming radio signals.

For embodiments shown in FIGS. 3(a), 3(b) and 3(c), no external bias circuitry is required to change the capacitance of the varactor elements, as it is seamlessly integrated within the EES structure. A second distinguishing feature is that these DC bias lines are fabricated using resistive inks, in contrast to the conventional approach using conductive DC bias lines, and thus nearly appear transparent to the radio-frequency (RF) behaviour of the EES, and have negligible or no negative impact on performance. Resistance on the order of at least a few hundred ohms would be typical in order for the bias lines to appear RF transparent. The use of these resistive bias lines is also closely linked to the integration of the varactor elements in the EES, which only require a DC voltage in order to control their capacitance.

By using a varactor element as described heretofore, advantageously, there is no continuous path for DC current to flow; the flow of significant DC current along highly resistive bias lines would result in substantial unwanted losses from voltage drops. Other devices such as certain diodes or transistors, for example that rely on DC bias currents could not be biased by resistive bias lines without incurring significant losses.

The embodiments of the invention described make use of a combination of ferroelectric inks with at least one of conductive, dielectric, and resistive inks printed in a multilayer process, along with patterning designs that allow for the monolithic fabrication of the required active devices and biasing circuitry for electronically controlling reconfigurable EESs. Methods for integrating such circuitry without disturbing the RF performance of the EES have previously posed a significant design challenge. However, in this invention, signal lines of the bias circuitry are formed by resistive segments, which are seamlessly routed throughout the EES structure formed by printing the conductive, dielectric and ferroelectric inks so as to minimize any impact on the RF performance of the EES. The resultant invention allows scalability of the EES in both size and frequency.

As mentioned above, the conductive, dielectric, resistive and ferroelectric inks are commercially available. Conductive inks, in particular are often composed of flakes of metal nanoparticles or silver or copper-based molecular inks such as those, for example, described in PCT/CA2015/050568.

Figure 4:
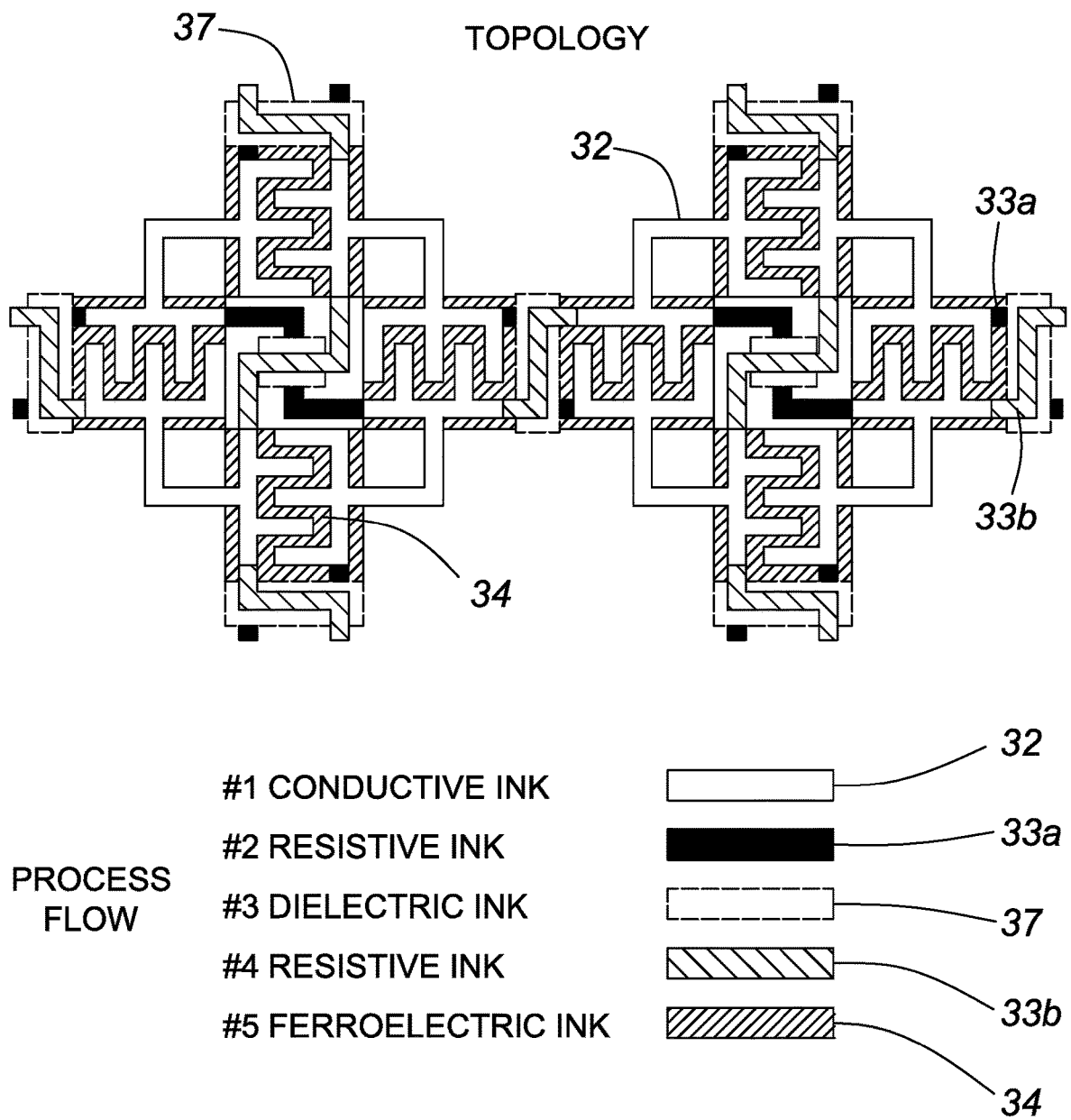
FIG. 4 shows the process flow for printing the reconfigurable EES shown in FIG. 3(a).

The flow process for fabrication is depicted in FIG. 4 where the numbering scheme corresponds to the sequence of the application of inks. For this particular embodiment, the substrate onto which the inks are printed is a flexible plastic (PET) of 5 mil thickness. Printing would also work well on thinner or thicker flexible plastic materials such as Kapton or Mylar, and the process could be adjusted to print on other materials such as papers, glass, or fabrics (textiles). The process flow is designed for screen-printing, but could also be adapted to other printing methods such as inkjet printing or any other printed electronics technology that is capable of multi-layer printing at the required resolution. The process could also be applied to rigid substrates such as rigid plastics, glass, or directly onto construction material like drywall or concrete. The separation between two adjacent unit cell elements is 4.0 mm in this specific case for operation at 28.0 GHz. The minimum line width and minimum gap between conductors was set to 75 µm to meet fabrication tolerances of print technology.

By using a combination of different printed electronic inks, for example, conductive, resistive, dielectric, and ferroelectric inks deposited on different layers, the electronically reconfigurable EES can be manufactured in a single process and be fully printable without the requirement for hybrid integration of separate, discrete devices, allowing the design to be scalable to large surface areas. Due to the fine feature sizes that can be printed using current printed electronics technology, this design is also scalable to millimeter-wave frequencies. As the minimum feature size attainable by printed electronics continues to shrink, the maximum frequency to which the invention can be designed will continue to increase, eventually possibly up to the Terahertz range. In short, the ability of printed electronics technology to deposit different types of inks in multiple layers onto large area flexible surfaces, combined with EES designs to exploit this capability and seamlessly incorporate biasing circuitry to develop electronically reconfigurable EES, offers significant advantages.

Combining printed electronics having printed biasing circuitry and novel EES designs, enables the production of low-cost, flexible electronically reconfigurable EES that are scalable in both size and frequency, which is a capability unavailable to any other technology or design. Furthermore, as new advancements are made in printed electronics technologies based on developments or improvements in semiconductor, carbon-nanotube, or other inks, this will enable new or enhance the current capabilities in electronically controlled reconfigurable EESs and extend the frequency limit to which these EESs can be scaled, possibly up to the terahertz range. Also, it is envisioned that the capacitive components could eventually be replaced by printed transistor switches using semi- or conductive ink.

Figure 5:
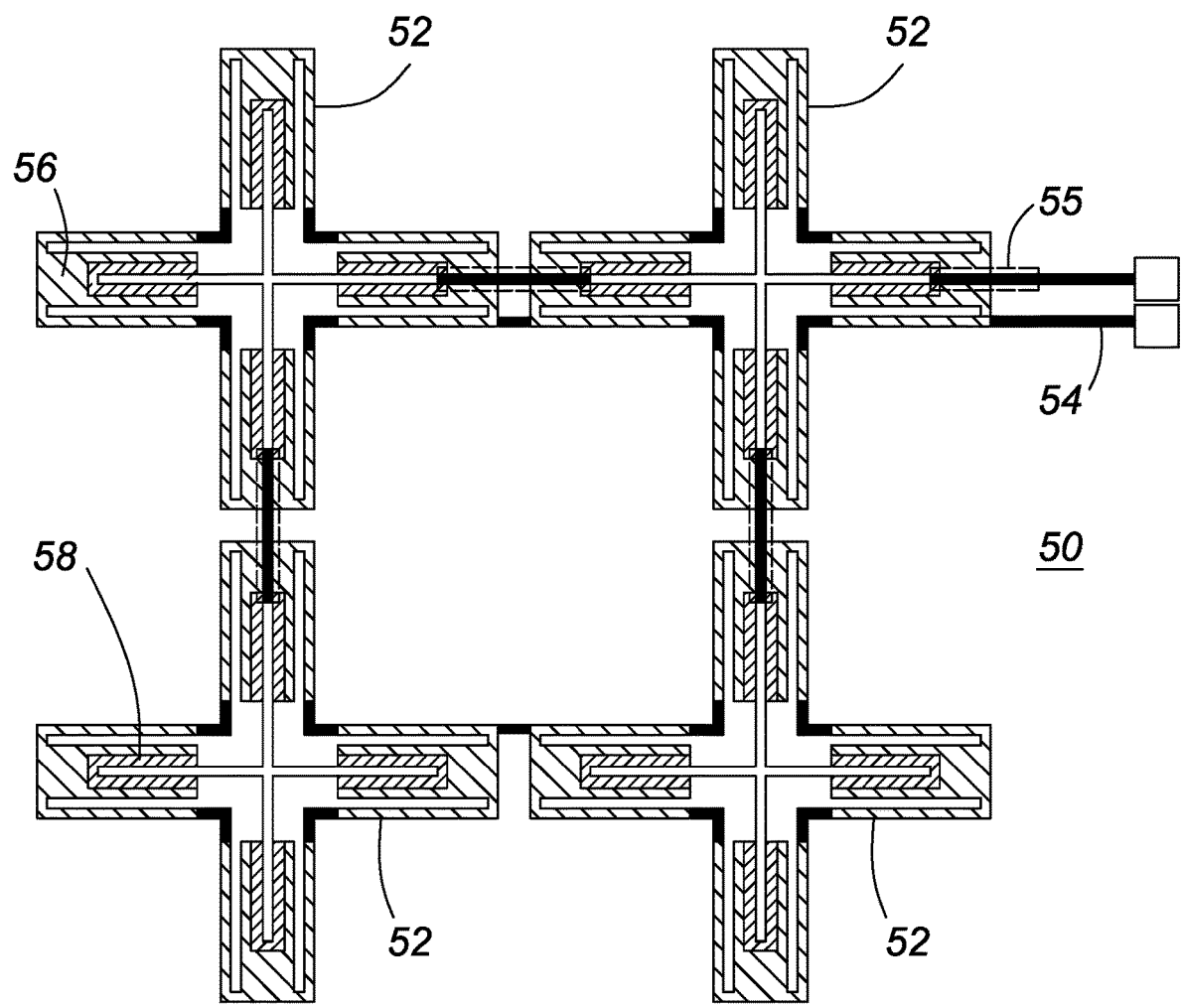
FIG. 5 is a top view of a a reconfigurable EES unit cell 50, which is of a cross shape.

FIG. 5 shows another embodiment of a reconfigurable EES unit cell 50, which is of a cross shape, compared to the square loop shape shown heretofore.

Again, the varactor elements 52, consisting of interdigital capacitors, form part of the element itself, and would be filled with ferroelectric material and biased with resistive lines 54 in order to shift the frequency of operation of the EES. In such an embodiment, this element can form part of an antenna array, and individually controlling the DC bias to each of these radiators would enable the electronic reconfiguration of the antenna radiation pattern. In another embodiment, these ferroelectric-filled capacitors could form phase-shifting elements that are integrated within the beamforming network of an antenna array and would be individually controlled to electronically reconfigure the radiation pattern.

Figure 6:
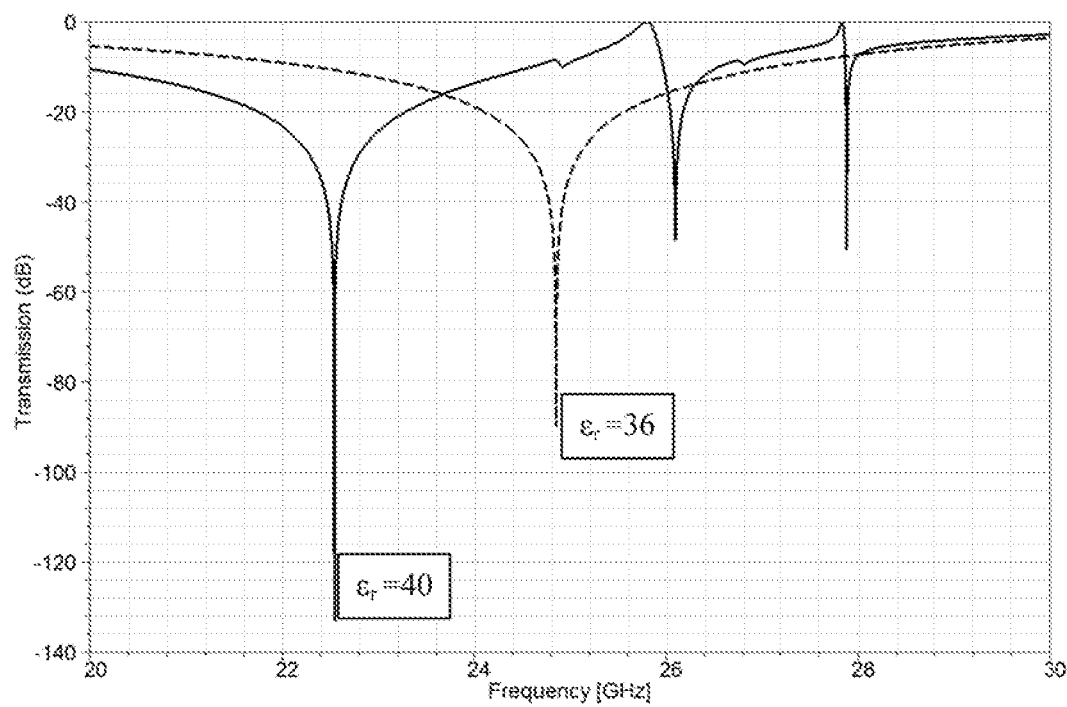
FIG. 6 is a graph of the simulated transmission behaviour of the electronically reconfigurable EES design of FIG. 3(a).

The behaviour of electronically reconfigurable EESs has been simulated using commercially available electromagnetic simulation software: High-Frequency Simulation Software (HFSS). FIG. 6 shows the simulated transmission behaviour of the electronically reconfigurable EES design of FIG. 3(a), where the ferroelectric material is assumed to have a tunability of 10%. Without DC voltage bias, the EES is designed to block frequencies centred around 25 GHz shown by the solid curve in FIG. 6. When the maximum value of DC bias is applied to cause a 10% shift in the permittivity of the ferroelectric material from a value of 36 to 40, the blocking centre frequency shifts from 25 GHz to approximately 22.6 GHz indicated by the dashed curve. If the application of interest is at 25 GHz, then the application and removal of the DC bias will cause the surface to either allow or block these RF signals to pass through, thus the EES can be switched on and off using DC voltage bias control.

Some embodiments of this invention apply to the field of EESs, where an intended application is deployment over wide surfaces, either indoor or outdoor, in such a way as to enhance the radio-propagation environment, by either blocking, re-directing, or letting pass specific radio frequency (RF) signals for mitigating interfering signals or for enhancing coverage in wireless communication systems. Based on fabrication using current printed electronics technology, the invention is scalable to current and planned cellular and WiFi bands up to the millimeter-wave bands being considered for use by future 5G wireless communications applications. As printed electronics technology improves, allowing for the printing of smaller and smaller feature sizes, the invention would be scalable to higher frequencies, possibly up to the Terahertz range.

Figure 7A:
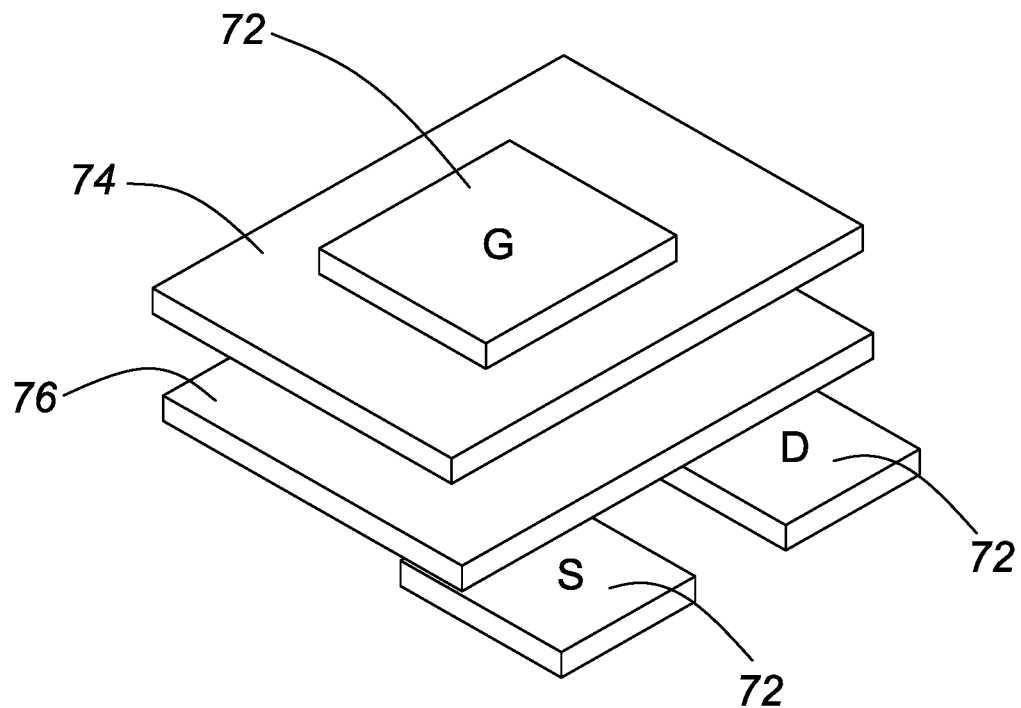
FIG. 7(a) is a diagram of a reconfigurable ESS having organic thin-film transistors (OTFTs)
Figure 7B:
FIG. 7(b) is a circuit representation of the OTFT shown in FIG. 7(a).

Turning now of FIG. 7(a), an ESS having organic thin-film transistors (OTFTs) at have been printed using conductive, dielectric, semiconductor, and resistive inks. Conductive ink 72 forms the Gate (G), Source (S) and Drain (D) terminals of the transistor. A layer of dielectric ink 74 and a layer of semiconductor ink 76 is printed between the G terminal and the S and D terminals. Four unit cells are shown in FIG. 7(a). A circuit representation of an OTFT is shown in FIG. 7(b).

Figure 8:
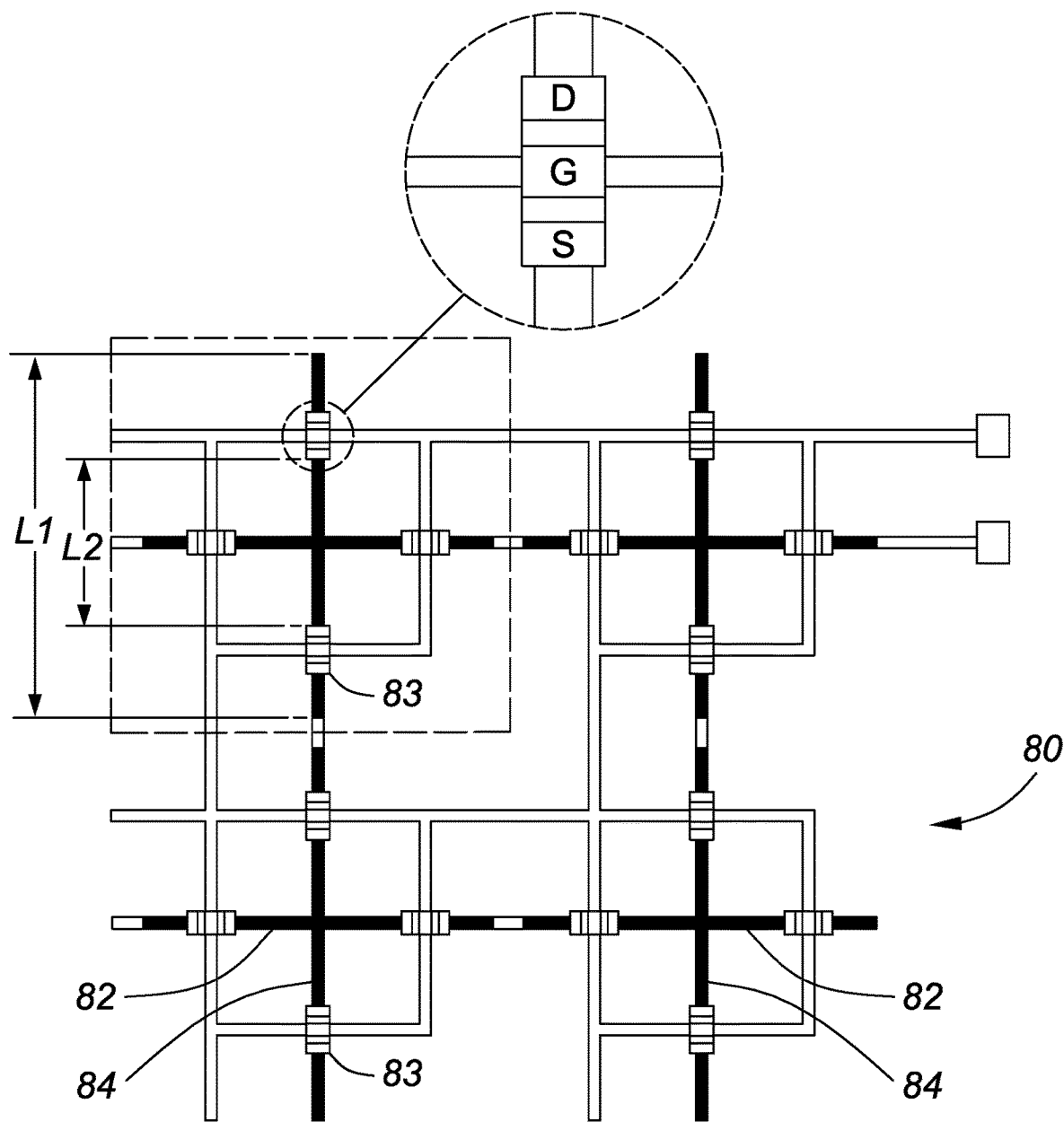
FIG. 8 is an embodiment of a portion of an engineered electromagnetic surface (EES) with embedded OTFTs.

FIG. 8 illustrates an exemplary embodiment of a portion of an engineered electromagnetic surface (EES) with embedded OTFTs 83. The EES 80 is shown having cross-shaped elements 82 with the OTFTs 83 integrated into the arms 84 of the cross shaped elements 82. Resistive bias lines (not shown) are connected to the gate (G) terminals of the OTFT 83, while the cross segments, formed from a conductive ink 82, are connected to either the source (S) or drain (D) terminals of the OFTFs 83. When the OFTFs 83 are biased in their OFF state, they act as open circuits, and the arms of the cross have an effective length of L1, resulting in a resonant frequency of F1. When the OFTFs 83 are biased in their ON state, they form a short circuit, connecting the segments of the cross arms to form an effective length of L2, resulting in a resonant frequency of F2. Thus, biasing the OFTFs 83 OFF or ON will result in the EES 80 from switching operation from frequency F1 to frequency F2. Frequencies F1 and F2 can be widely separated, since they are controlled solely by the lengths of the cross arm segments (L1 and L2). This differs from the varactor-tuned EES designs, where applying the bias will only result in tuning the frequency of operation by a small percentage around the original resonant frequency.

It should be understood that the terms "printed thereon" or "printed on the substrate" when referring to ink printed on the substrate can mean directly on and contacting the substrate or over a layer carried by the substrate such as a layer that has been printed on the substrate, wherein all of these layers are supported by the substrate.

What is claimed is:

1. An electronic component comprising:
a non-conducting substrate having printed thereon, in predetermined patterns, one or more layers of material wherein some of the material is ferroelectric or semi-conductive material and some of the material is at least one of conductive, dielectric, and resistive; and, printed resistive biasing circuitry having a resistance of at least 100 ohms per square millimetre, supported by the substrate, electrically coupled to one or more of the printed layers, wherein when a changing voltage is applied to the resistive biasing circuitry, an electronic property of the electronic component changes in response to the changing voltage.

2. An electronic component as defined in claim 1, wherein the electronic property is capacitance and wherein the material is dried ink and wherein the resistive biasing circuitry has a resistance of at least 200 ohms per square millimetre.

3. An electronic component as defined in claim 2 wherein the one or more layers of material comprise a conductive material and the ferroelectric material printed in an inter-digitated pattern, forming a capacitive component, and wherein the resistive biasing circuitry is electrically coupled to the capacitive component for providing a varying voltage to the capacitive component for varying its capacitance.

4. An electronic component as defined in claim 1 wherein the one or more layers of material are a semi-conductive material and wherein the one or more printed layers of material form one or more transistors.

5. An electronic component as defined in claim 1 wherein the one or more layers comprises a first layer of a printed material having a first electrical property, a second layer of a second printed material having a second different electrical property, and a third layer of a printed material having the first electrical property and wherein the printed biasing circuitry is electrically coupled to the first and third layers for providing a varying voltage to the component for varying a capacitance.

6. An electronic component as defined in claim 5, wherein the component is a voltage controllable capacitor and wherein the first layer and the third layers of printed material are conductive materials and wherein the second printed material layer is a ferroelectric material, and wherein the resistive biasing circuitry has a resistance of at least 200 ohms per square millimeter.

7. An electronic component as defined in claim 1, wherein the resistive biasing circuitry is electrically connected to a variable voltage source.

8. An electronic component comprising:
a non-conducting substrate having printed thereon:
a) a printed layer of conductive material to provide a loop resonator;
b) a plurality of printed layers forming metal insulator metal capacitors for loading the loop resonator, wherein each capacitor is formed of a printed ferroelectric material and at least a printed conductive, dielectric or resistive material, or
c) a printed conductive material and a printed ferroelectric material in interdigitated patterns forming capacitors for loading the loop resonator; and,
d) printed resistive biasing circuitry electrically coupled to the capacitors for providing a varying voltage from a voltage source to the capacitors and for varying capacitance and for varying a resonant frequency of the loop resonator wherein the resistive biasing circuitry has a resistance of at least 100 ohms per square millimeter.

9. An electronic component as defined in claim 8, wherein the component is voltage controllable so as to be reconfigurable and wherein the material is a dried or cured ink.

10. An electronic component as defined in claim 9 wherein the printed conductive material is a silver or copper-based molecular dried ink.

11. An electronic component as defined in claim 8 wherein the electronic component is absent discrete components.

12. An electronic component comprising: a dielectric substrate having printed thereon one or more layers of printed material wherein a conductive material and ferro-electric material is printed on a layer so as to provide a loop resonator printed thereon and inter-digitated patterns printed thereon forming capacitors for loading the loop; and resistive biasing circuitry having a resistance of at least 100 ohms per square millimeter printed on the substrate electrically coupled to the capacitors for providing a varying voltage from a voltage source to the capacitors and for varying capacitance and for varying a resonant frequency of the loop resonator, wherein the electronic component is a dynamically tunable resonator circuit.

13. An electronic component as defined in claim 12 wherein the loop resonator is a square loop resonator.

14. An electronic component as defined in claim 12 wherein the loop resonator is a self-resonating structure and wherein a variance of the capacitance varies a resonant frequency of the loop resonator.

15. An electronic component as defined in claim 12 wherein the biasing circuitry is printed with a resistive material having a resistance of at least 200 ohms per square millimetre.

16. An electronic component comprising: a dielectric substrate having printed thereon one or more layers of printed material wherein a layer of conductive material is printed thereon so as to provide a loop resonator printed thereon and a plurality of layers are printed thereon forming metal insulator metal capacitors for loading the loop; and resistive biasing circuitry printed on the substrate electrically coupled to the capacitors for providing a varying voltage from a voltage source to the capacitors and for varying its capacitance and for varying a resonant frequency of the loop resonator, wherein each of the metal insulator metal capacitors are formed of a ferroelectric material and at least a conductive, dielectric, or resistive material, wherein the electronic component is a dynamically tunable resonator circuit.

17. A plurality of electronic components as defined in claim 16 wherein the resonator circuits are interconnected so as to form a frequency selective surface.

18. An electronic components as defined in claim 17, wherein each of the resonator circuits are connected to a same biasing circuit and wherein the biasing circuit has a resistance of at least 100 ohms per square millimeter.

19. An electronic component as claimed in claim 16, wherein the material is a dried or cured ink and wherein the resistive biasing material has a resistance of at least 100 ohms per square millimetre.

20. An electronic component as claimed in claim 19, wherein some of the ink is a silver or copper-based molecular ink.

* * * * *